(12) United States Patent
Kitamura et al.

(10) Patent No.: US 9,072,205 B1
(45) Date of Patent: Jun. 30, 2015

(54) SURFACE MOUNTING METHOD UTILIZING ACTIVE RESIN COMPOSITION

(71) Applicant: SAN-EI KAGAKU CO., LTD., Tokyo (JP)

(72) Inventors: Kazunori Kitamura, Saitama (JP); Yasuhiro Takase, Saitama (JP); Kazuki Hanada, Saitama (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 0 days.

(21) Appl. No.: 14/612,310

(22) Filed: Feb. 3, 2015

Related U.S. Application Data (62) Division of application No. 13/339,981, filed on Dec. 29, 2011, now abandoned.

(30) Foreign Application Priority Data

Jan. 4, 2011 (JP) ................................. 2011-011378
Aug. 25, 2011 (JP) ................................. 2011-198839

(51) Int. Cl.
| | |
|---|---|
| *H05K 3/34* | (2006.01) |
| *H05K 3/30* | (2006.01) |
| *H05K 3/32* | (2006.01) |
| *H01L 21/58* | (2006.01) |
| *B23K 1/20* | (2006.01) |
| *B23K 1/00* | (2006.01) |
| *H05K 13/04* | (2006.01) |
| *C09J 163/00* | (2006.01) |

(52) U.S. Cl.
CPC *H05K 3/305* (2013.01); *B23K 1/20* (2013.01); *B23K 1/0016* (2013.01); *H05K 13/0465* (2013.01); *B23K 2001/12* (2013.01); *H05K 3/341* (2013.01); *H01L 21/58* (2013.01)

(58) Field of Classification Search
CPC ........... H05K 1/18; H05K 1/181; H05K 3/30; H05K 3/301; H05K 3/303; H05K 3/305; H01L 21/58; H01L 23/488; H01L 23/49513; H01L 24/10; H01L 24/11; H01L 24/26; H01L 24/27; H01L 2224/32151; H01L 2224/32221; H01L 2224/32225; H01L 2224/32227; H01L 2224/32235; H01L 2224/325; H01L 2224/32501; B32B 27/38; C08G 59/18; C08G 59/4021; C08G 59/4284; C08K 5/09; C08K 5/092; C08K 5/101; C08K 5/11; C08K 5/12; C09J 163/00
USPC .......... 428/413, 414, 416, 418, 901; 438/106, 438/118, 127; 523/400, 455; 525/533; 257/787, 783; 156/330
See application file for complete search history.

(56) References Cited

U.S. PATENT DOCUMENTS

| | | |
|---|---|---|
| 8,551,819 B2 | 10/2013 | Kitamura et al. |
| 2003/0219619 A1 | 11/2003 | Noro et al. |
| 2011/0031300 A1 | 2/2011 | Kitamura et al. |
| 2012/0153009 A1 | 6/2012 | Kitamura et al. |

FOREIGN PATENT DOCUMENTS

| | | |
|---|---|---|
| JP | 2002-237676 | 8/2002 |
| JP | 2002-293883 | 10/2002 |
| JP | 2004-152936 | 5/2004 |
| JP | 2007-005750 | 1/2007 |

*Primary Examiner* — Michael J Feely
(74) *Attorney, Agent, or Firm* — Young & Thompson

(57) ABSTRACT

A surface mounting method includes applying an active resin composition to at least part of a surface of a printed wiring substrate; mounting a surface mount device on the substrate; performing reflow soldering; applying an under-filling resin into a space of interest; before and/or after applying the under-filling resin, performing a vacuum treatment and/or heating at a temperature lower than the curing reaction-initiating temperature of any of the applied active resin composition and the under-filling resin; and subsequently, thermally curing the resin composition and the under-filling resin. The active resin composition contains an epoxy resin in an amount of 100 parts by weight, a blocked carboxylic acid compound in an amount of 1-50 parts by weight and/or a carboxylic acid compound in an amount of 1-10 parts by weight, and a curing agent which can initiate curing reaction at 150° C. or higher, in an amount of 1-30 parts by weight.

12 Claims, 7 Drawing Sheets

SURFACE MOUNTING METHOD UTILIZING ACTIVE RESIN COMPOSITION

This is a divisional application of U.S. Ser. No. 13/339,981, filed Dec. 29, 2011 (now abandoned), which claims priority to Japanese Patent Applications No. 2011-011378 filed on Jan. 4, 2011, and No. 2011-198839 filed on Aug. 25, 2011.

BACKGROUND OF THE INVENTION

1. Field of the Invention

The present invention relates to an active resin composition suitably employed in flip-chip mounting, to a surface mounting method, and to a printed wiring board produced through the surface mounting method.

2. Background Art

Conventionally, mounting of surface mount devices such as BAG parts on the surface of a printed wiring substrate has been carried out through a procedure including application of a flux onto the surface; mounting BGA parts on a printed wiring substrate; reflow soldering; washing off the flux; filling the space between the printed wiring substrate and the BAG parts with an under-filling resin; and curing the under-filling resin. As disclosed in Japanese Patent Application Laid-Open (kokai) No. 2004-152936 (claim 2), a flux known in the art contains, as an activating agent, a compound having a carboxylic acid group (e.g., rosin).

Meanwhile, a BGA part includes a plurality of mounted chips for enhancing device performance. Thus, the dimensions of such a BGA part have gradually over the years.

When the size of a BGA device increases, washing off the flux is hindered by the presence of BGA parts, and unremoved flux (i.e., flux residue) may remain. As a result, an activating agent contained in the flux residue causes problematic corrosion reaction during a subsequent step; i.e., a thermal curing of under-filling resin.

Meanwhile, as disclosed in Japanese Patent Application Laid-Open (kokai) No. 2002-237676, another type of the flux is a wash-less flux, which contains a less-corrosive activating agent having low activity and which requires no washing step. When such a wash-less flux is used, the wash-less flux generates decomposition gas during thermal curing of the under-filling resin, resulting in destruction of BGA parts, which is also problematic.

Furthermore, when the size of a BGA part increases, connection portions between BGA parts impedes filling the space with under-filling resin. Particularly when the surface of a printed wiring substrate has dents and protrusions (circuits, solder resist, etc.), the dents cannot be completely filled with the under-filling resin, in some cases, providing voids and unfilled portions. As a result, quality and reliability of products are considerably impaired. If such voids or the like are not found, when a subsequent step of thermally curing the under-filling resin is performed, the products cannot be repaired and must be discarded, thereby lowering product yield.

SUMMARY OF THE INVENTION

The present invention provides an active resin composition and a surface mounting method employing the resin composition, exhibiting the below-described meritorious effects.

1) In the surface mounting method, the step of washing off the flux can be eliminated, leading to reduced production cost and enhanced productivity.

2) The cured products of applied resin, under-filling resin, etc. have no defects such as bubbles and voids, leading to enhancement in device reliability.

3) Considerably high thermal stability of the cured product of applied resin prevents corrosion reaction at high temperature, and generation of unfavorable decomposition gas.

More preferably, according to the present invention, 4) filling the spaces of interest with under-filling resin is facilitated. As a result, even when large-scale BGA parts are mounted, the cured portion of the under-filling resin is free from bubbles and voids and the resin-unfilled portions are no generated, whereby reliable bonding (adhesion) can be attained, and device reliability can be enhanced.

Also, the present invention provides:

5) an active resin composition having high storage stability.

The present inventors have carried out extensive studies in order to attain the aforementioned objects.

Accordingly, in a first mode of the present invention, there is provided an active resin composition comprising an epoxy resin in an amount of 100 parts by weight, a blocked carboxylic acid compound in an amount of 1 to 50 parts by weight and/or a carboxylic acid compound in an amount of 1 to parts by weight, and a curing agent which can initiate curing reaction at 150° C. or higher, in an amount of 1 to 30 parts by weight.

In a second mode of the present invention, there is provided a surface mounting method comprising:

applying an active resin composition of the first mode to at least a part of a surface of a printed wiring substrate;

mounting a surface mount device on the printed wiring substrate;

performing reflow soldering;

performing a vacuum treatment and/or heating at a temperature lower than the curing reaction-initiating temperature of the applied active resin composition; and subsequently, thermally curing the applied resin composition.

In a third mode of the present invention, there is provided a surface mounting method comprising:

applying an active resin composition of the first mode to at least a part of a surface of a printed wiring substrate;

mounting a surface mount device on the printed wiring substrate;

performing reflow soldering;

putting an under-filling resin into a space of interest;

before and/or after putting in the under-filling resin, performing a vacuum treatment and/or heating at a temperature lower than the curing reaction-initiating temperature of any of the applied active resin composition and the under-filling resin; and subsequently, thermally curing the applied active resin composition and the under-filling resin.

In the second and third modes of the invention, the active resin composition may be applied to at least a part of a metallic surface of the printed wiring substrate.

In the second and third modes of the invention, before mounting the surface mount device on the printed wiring substrate, there may be performed drying the applied resin composition and/or heating at a temperature which is equal to or higher than softening temperature of the applied resin composition and which is lower than the curing reaction-initiating temperature.

In a fourth mode of the present invention, there is provided a printed wiring board produced through any of the aforementioned surface mounting methods.

By use of the active resin composition of the present invention, the following meritorious effects can be attained.

The present invention provides an active resin composition and a surface mounting method employing the resin composition, exhibiting the below-described effects.

1) In the surface mounting method, the step of washing off the flux can be eliminated, leading to reduced production cost and enhanced productivity.

2) The cured products of applied resin, under-filling resin, etc. have no defects such as bubbles and voids, leading to enhancement in device reliability.

3) Considerably high thermal stability of the cured product of applied resin prevents corrosion reaction at high temperature, and generation of unfavorable decomposition gas.

4) Filling the spaces of interest with under-filling resin is facilitated. As a result, even when large-scale BGA parts are mounted, the cured portion of the under-filling resin is free from bubbles and voids and the resin-unfilled portions are no generated, whereby reliable bonding (adhesion) can be attained, and device reliability can be enhanced.

In a preferred embodiment of the active resin composition of the present invention, 5) the storage stability of the active resin composition can be enhanced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Best modes of the present invention will next be described with reference to the drawings.

The active resin composition employed in the surface mounting method of the present invention contains an epoxy resin, which also serves a matrix resin. The epoxy resin reacts with the below-described activating agent during the curing reaction, to thereby deactivate the activating agent. By virtue of the epoxy resin, the cured active resin composition has very high thermal stability, and therefore, corrosion and generation of decomposition gas during heating (e.g., thermal curing of the under-filling resin) are prevented.

Examples of the epoxy resin include epoxy resins which assume solid at room temperature. The epoxy resin preferably has a softening temperature of, for example, 70 to 150° C., particularly preferably 80 to 100° C. Specific examples of the solid epoxy resin include cresol-novolak epoxy resin, dicyclopentadienyl-type epoxy resin, biphenyl-type epoxy resin, bisphenol A-type solid epoxy resin, and solid alicyclic epoxy resin.

Alternatively, the epoxy resin may be an epoxy resin which assumes liquid at room temperature. The liquid epoxy resin is an epoxy resin which is liquid or semi-solid at ambient temperature, for example, an epoxy resin having fluidity at ambient temperature. Such liquid epoxy resin preferably has a viscosity (room temperature) of, for example, 20,000 mPa·s or lower, particularly preferably 1,000 to 10,000 mPa·s.

Specific examples of the liquid epoxy resin include liquid bisphenol A-type epoxy resins represented by the following formula:

(wherein n is 0 or 1, and G represents glycidyl group). These epoxy resins may be used singly or in combination. Specific examples further include liquid bisphenol F-type epoxy resins represented by the following formula:

(wherein n is 0 or 1, and G represents glycidyl group). These epoxy resins may be used singly or in combination.

Specific examples of the liquid epoxy resin further include naphthalene-type epoxy resin, diphenyl thioether (sulfide)-type epoxy resin, trityl-type epoxy resin, alicyclic epoxy resin, alcohol-derived epoxy resin, diallyl bis-A-type epoxy resin, methylresorcinol-type epoxy resin, bisphenol AD-type epoxy resin, and N,N,O-tris(glycidyl)-p-aminophenol. These epoxy resins may be used singly or in combination.

Examples of preferred liquid epoxy resins include bisphenol A-type epoxy resin, bisphenol F-type epoxy resin, N,N, O-tris(glycidyl)-p-aminophenol, and bisphenol AD-type epoxy resin. These epoxy resins may be used singly or in combination.

The active resin composition of the invention contains a blocked carboxylic acid compound and/or a carboxylic acid compound. The carboxylic acid species serves as an activating agent.

The blocked carboxylic acid compound is synthesized through reaction between a carboxylic acid compound with a blocking agent. When the blocked carboxylic acid compound is used, side reaction at low temperature can be inhibited, to thereby enhance storage stability of the active resin composition.

The carboxylic acid compound, serving as a starting material for synthesizing the blocked carboxylic acid compound, may be a monocarboxylic acid compound. Specific examples of the starting carboxylic acid compound include aromatic monocarboxylic acids (e.g., (hydroxy)benzoic acid, dihydroxybenzoic acid, phenylacetic acid, benzoic acid, toluic acid, and naphthoic acid); saturated monocarboxylic acids (e.g., acetic acid, propionic acid, butyric acid, 2-methylpropanoic acid (isobutyric acid), 2-ethylhexanoic acid, lauric acid, and cyclohexanecarboxylic acid); unsaturated monocarboxylic acids (e.g., acrylic acid, methacrylic acid, crotonic acid, and oleic acid); and abietic acid.

Specific examples of the starting carboxylic acid compound further include polycarboxylic acid compounds. More specific examples include aliphatic polyvalent carboxylic acids (e.g., oxalic acid, malonic acid, succinic acid, glutaric acid, adipic acid, azelaic acid, sebacic acid, decamethylenedicarboxylic acid, butanetetracarboxylic acid, and 1,2,3,4-butanetetracarboxylic acid); aromatic polyvalent carboxylic acids (e.g., phthalic acid, isophthalic acid, terephthalic acid, trimellitic acid, pyromellitic acid, naphthalenedicarboxylic acid, and benzenecarboxylic acid (in particular, having 3 to 4 carboxylic groups)); alicyclic polyvalent carboxylic acids (e.g., tetrahydrocarboxylic acid, hexahydrocarboxylic acid, tetrahydrophthalic acid, and hexahydrophthalic acid); unsaturated aliphatic polyvalent carboxylic acids (e.g., maleic acid, fumaric acid, and itaconic acid); polyvalent carboxylic acids produced through half-esterification between polyol having two or more (preferably 2 to 50) hydroxyl groups and acid anhydride; polyvalent carboxylic acids produced through addition reaction between polyisocyanate having two or more (preferably 2 to 50) isocyanato groups and hydroxycarboxylic acid or amino acid; polyvalent carboxylic acids produced through homo- or co-polymerization of unsaturated carboxylic acid(s); polyester-type polyvalent carboxylic acids produced through reaction between polyol and polyvalent carboxylic acid; and carboxylic acid polymers (e.g., styrene-maleic acid copolymer and acrylic acid copolymer).

The blocking agent, serving as the other starting material for synthesizing the blocked carboxylic acid compound, is preferably a compound whose carboxyl-blocking (protecting) group is removed at the curing reaction-initiating temperature of the active resin composition. Specific examples of the starting blocking agent include compounds having one vinyl ether moiety in the molecules thereof, more specifically, aliphatic vinyl ethers (e.g., methyl vinyl ether, ethyl vinyl ether, isopropyl vinyl ether, n-propyl vinyl ether, isobutyl vinyl ether, n-butyl vinyl ether, cyclohexyl vinyl ether, propyl vinyl ether, butyl vinyl ether, 2-ethylcyclohexyl vinyl ether, t-butyl vinyl ether, and 2-ethylhexyl vinyl ether); cyclic vinyl ethers (e.g., 2,3-dihydrofuran, 2,3-dihydro-2H-pyran, 3,4-dihydro-2H-pyran, 3,4-dihydro-2-methoxy-2H-pyran, 3,4-dihydro-4,4-dimethyl-2H-pyran-2-one, 3,4-dihydro-2-ethoxy-2H-pyran, sodium 3,4-dihydro-2H-pyran-2-carboxylate, and 3,4-dihydrofuran); aliphatic vinyl thioether compounds (e.g., dihydrofuran); cyclic vinyl ether compounds (e.g., dihydro-2H-pyran); and cyclic vinyl thioether compounds.

Specific examples of the starting blocking agent further include compounds having two or more vinyl ether moieties in the molecules thereof, more specifically, divinyl ether compounds (e.g., ethylene glycol divinyl ether, 1,2-propylene glycol divinyl ether, 1,3-propylene glycol divinyl ether, 1,3-butanediol divinyl ether, 1,4-butanediol divinyl ether, 2,3-butanediol divinyl ether, 1,6-hexanediol divinyl ether, diethylene glycol divinyl ether, triethylene glycol divinyl ether, pentanediol divinyl ether, dimethylbutanediol divinyl ether, 3-methyl-1,5-pentanediol divinyl ether, hydrogenated bisphenol A divinyl ether, neopentyl glycol divinyl ether, 1,8-octanediol divinyl ether, 1,4-cyclohexanedimethanol divinyl ether, 2-methyl-1,3-propanediol divinyl ether, 1,4-cyclohexanediol divinyl ether, 1,9-nonanediol divinyl ether, triethylene glycol divinyl ether, tetraethylene glycol divinyl ether, bisphenol A divinyl ether, and hydrogenated bisphenol A divinyl ether), and divinyl thioether compounds.

Specific examples of the blocked carboxylic acid compound include bisalkyl esters of cyclohexanedicarboxylic acid, 1-isopropoxyethyl(meth)acrylate, 1-ethoxyethyl(meth) acrylate, 1-t-butoxyethyl(meth)acrylate, 1-(1-methylhexyloxy)ethyl(meth)acrylate, 1-(1,1-dimethylpropoxy)ethyl (meth)acrylate, 1-isopropoxyethyl(meth)acrylamide, 1-ethoxyethyl(meth)acrylamide, 1-t-butoxyethyl(meth)acrylamide, 1-(1-methylhexyloxyl)ethyl(meth)acrylamide, 1-(1, 1-dimethylpropoxy)ethyl(meth)acrylamide, 1,2,4-benzenetricarboxylic acid 2,4-bis(propoxyethyl)-1-((meth) acryloxyethyl) ester, and (co)polymers thereof. These compounds may be used singly or in combination.

Specific examples of commercial products of the blocked carboxylic acid compound include Santacid G, Santacid FK-03, Santacid FK-05, Santacid FK-16, Santacid KM-01, Nofcure-TN-2, Nofcure-OP, and Nofcure-TY501 (products of NOF Corporation). These compounds may be used singly or in combination.

Instead of or in addition to the blocked carboxylic acid compound, the carboxylic acid compound itself may be used. The carboxylic acid compound may be the same as those exemplified as the aforementioned starting material for synthesizing the blocked carboxylic acid compound. These compounds may be used singly or in combination.

The active resin composition of the invention contains a curing agent. The curing agent can initiate curing reaction at 150° C. or higher (preferably 160 to 200° C.) Through employment of the curing agent that acts at high temperature, no curing reaction occurs by heating for a short period of time. Thus, curing of the active resin composition during reflow soldering can be prevented. Specific examples of the curing agent include dicyandiamide.

The active resin composition may further contain a solvent. Particularly when the composition contains a solid material (solid epoxy resin or the like), incorporation of a solvent is preferred. The solvent preferably has a boiling point lower than the curing reaction-initiating temperature, particularly preferably 150 to 200° C. Specific examples of the solvent include glycol ethers, ethylene glycol ether esters, propylene glycol ether esters, and N-methylpyrrolidone.

The active resin composition may contain other additives such as a defoaming agent (e.g., polydimethylsiloxane), a silane coupling agent, and Aerosil.

The active resin composition contains an epoxy resin in an amount of 100 parts by weight, a blocked carboxylic acid compound in an amount of 1 to 50 (preferably 10 to 40) parts by weight and/or a carboxylic acid compound in an amount of 1 to 10 (preferably 2 to 5) parts by weight, and a curing agent in an amount of 1 to 30 (preferably 2 to 7) parts by weight. The amount of solvent is preferably 10 to 300 (preferably 30 to 100) parts by weight.

The active resin composition may or may not contain a solvent and may assume solid or liquid form. However, in a preferred embodiment, the active resin composition assumes in the form of a solid having a softening temperature of 50 to 150 (particularly 80 to 120°) C., after removal of solvent (or drying of resin). In the case where the softening temperature is excessively low, the composition exhibits a tacky property even at room temperature, possibly resulting in deposition of dust (i.e., migration of foreign matter into the device), whereas when the softening temperature is excessively high, defoaming during the vacuum treatment performed after reflow-mounting may be insufficient. In addition, the active resin composition is preferably re-softened by heating after solidification by cooling.

Figure 1A:
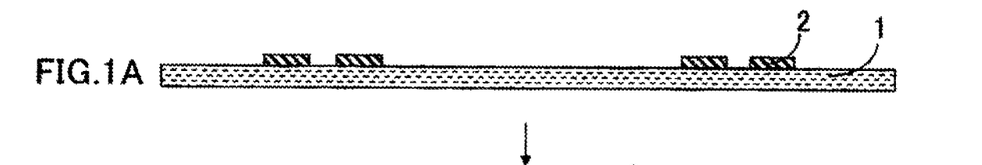
FIGS. 1A, 1B, 1C, 1D, and 1E are sketches with cross-sections showing steps of an embodiment of the mounting method of the present invention.
Figure 1B:
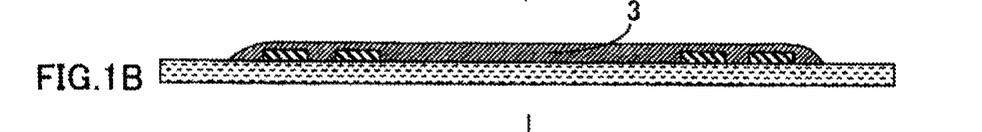

In one embodiment of the surface mounting method of the present invention, an active resin composition 3 (FIG. 1B) falling within the scope of the invention is applied to at least a part of the surface (or the entire surface) of a printed wiring substrate 1 (FIG. 1A). Hereinafter, the thus-applied active resin composition may be referred to as "applied resin." The active resin composition may be applied to at least a part of a metallic surface of the printed wiring substrate. The metallic surface may be formed of, for example, at least one species selected from among pure metals (e.g., copper) and alloys (e.g., solder). More specifically, the resin composition may be applied onto at least a part of a circuit and/or at least a part of a pad 2 (FIG. 1A). Furthermore, the resin composition may be applied to at least a solder portion of a surface mount device 4 (FIG. 1C) serving as a member to be bonded. More specifically, the resin composition may be applied to the entire bottom surface of the surface mount device or to a bump 9 (FIG. 1C) of the surface mount device. The applied resin generally has a thickness of 10 to 50 μm.

Thereafter, if needed (for example, in the case where a solid epoxy resin and a solvent is used), the applied resin may be dried for removal of the solvent. Through drying, the applied resin generally assumes the form of a tack-free coating film. The drying conditions may be 80 to 120° C. for 10 to 30 minutes.

Alternatively, if needed (for example, in the case where the dried applied resin assumes solid), the applied resin may be heated at a temperature which is equal to or higher than the softening temperature of the applied resin and which is lower than the curing reaction-initiating temperature (hereinafter this heating process may be referred to as "heating A"). Through heating A, the applied resin generally exhibits tacky property, whereby mounting of a surface mount device is facilitated. The heating conditions may be 80 to 180° C. for 10 seconds to 10 minutes.

Drying and heating A of the applied resin may be performed singly or in combination, and sequentially in any order or simultaneously.

Figure 1C:
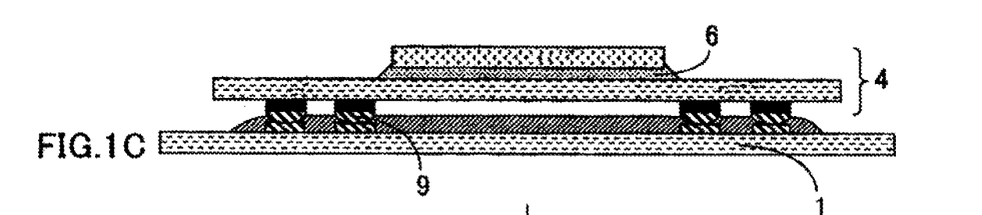

Subsequently, the surface mount device 4 (FIG. 1C) is mounted on the printed wiring substrate 1 (FIG. 1C). In the present invention, there may be large-scale surface mount devices; for example, those of 50 mm×50 mm squares or more. Specifically, the surface mount device may be a package device or a semiconductor chip. Examples of the package device include BGA parts, CSP parts, MCM parts, IPM parts, and IGBT parts.

Figure 1D:
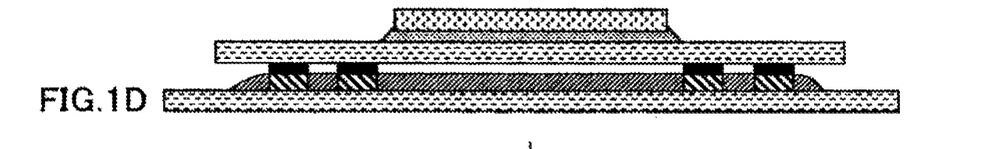

Next, reflow soldering is performed (FIG. 1D). The reflow conditions may be 240 to 300° C. for 10 seconds to 10 minutes. When the reflow heating time is excessively long, the applied resin may undergo curing reaction, which is not preferred.

Subsequently, there is performed a vacuum treatment and/or heating of the applied resin at a temperature lower than the curing reaction-initiating temperature (hereinafter this heating process may be referred to as "heating B").

The vacuum treatment is performed for the following reasons. Specifically, during reflow soldering, oxides or the like present on the surface of molten solder undergo chemical reaction (including reduction) by the applied resin (active resin composition), to thereby possibly form water or other substances. In the case where the formed water or other substances remain in the applied resin, they are evaporated with volume expansion during thermal curing of the resin, whereby the cured applied resin may have bubbles, voids, etc. Therefore, the vacuum treatment is performed for the purpose of removing water or the like in advance. In addition, through the vacuum treatment, defoaming of the applied resin or the like is completed. Preferred vacuum treatment conditions include a vacuum degree of 10 to 80,000 (particularly 100 to 50,000) Pa for 1 to 60 (particularly 5 to 30) minutes.

Heating B is performed at a temperature lower than the curing reaction-initiating temperature of the applied resin. In the case where the applied resin is solid, heating B is preferably performed at a temperature equal to or higher than the softening temperature of the applied resin. Through heating B, dehydration and defoaming of the resin or the like is completed. In the above case, the applied resin is softened through heating B, and the thus-softened applied resin buries the irregularities of the surface of the printed wiring substrate (i.e., planarization). As a result, when a space of interest is filled with the under-filling resin, resin filling is facilitated, whereby the cured under-filling resin includes no bubbles, voids, or resin-unfilled cavities. Preferred specific heating conditions include 60 to 150 (particularly 80 to 120°) C. for 0.1 to 60 (particularly 1 to 10) minutes.

The vacuum treatment and heating B may be performed singly or in combination, and sequentially in any order or simultaneously. Preferably, at least the vacuum treatment is performed.

Figure 1E:
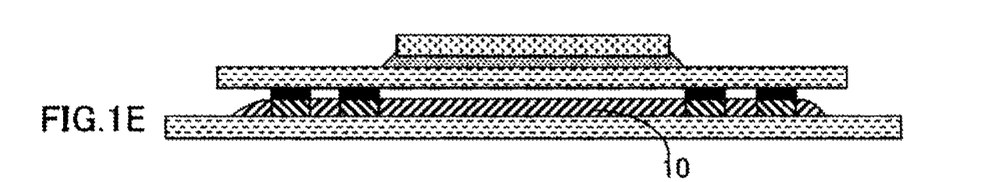

Subsequently, the applied resin 10 is thermally cured (FIG. 1E). The thermal curing temperature is equal to or higher than the curing reaction-initiating temperature provided by the curing agent. Specific thermal curing conditions include 150 to 200° C. for 1 to 4 hours. In this case, the blocked carboxylic acid compound and/or carboxylic acid compound react(s) with the epoxy resin, thereby losing the activity as the activating agent. Thus, impairment of reliability, which would otherwise be caused by corrosion or the like, can be prevented.

As described above, the printed wiring board of the present invention is produced.

Figure 2A:
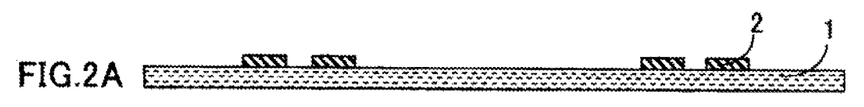
FIGS. 2A, 2B, 2C, 2D, 2E, and 2F are sketches with cross-sections showing steps of another embodiment of the mounting method of the present invention.
Figure 2B:
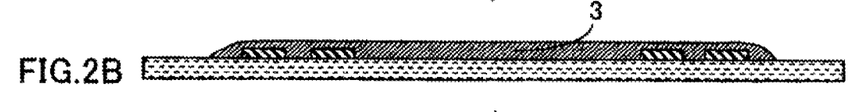
Figure 2C:
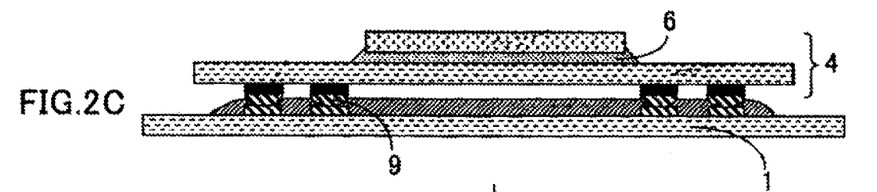
Figure 2D:
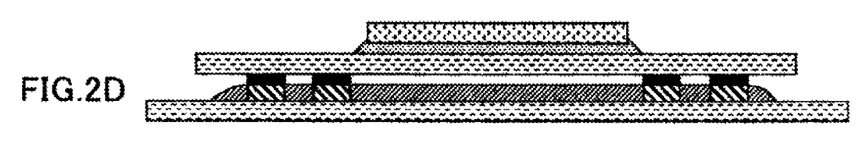

In another embodiment of the surface mounting method of the present invention, similar to the first embodiment, the above-described steps; from application of active resin to reflow soldering, are performed. Specifically, the aforementioned active resin composition 3 (FIG. 2B) is applied to at least a part of the surface of a printed wiring substrate 1 (FIG. 2A). A surface mount device 4 (FIG. 2C) is mounted on the printed wiring substrate 1 (FIG. 2C). Then, reflow soldering is performed (FIG. 2D).

Figure 2E:
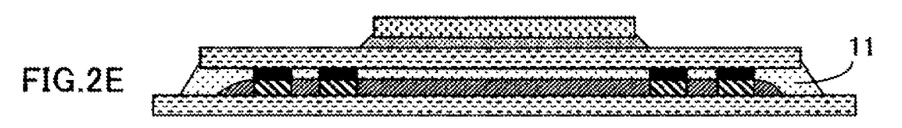

For the purpose of packaging and other reasons, a space of interest is filled with an under-filling resin 11 (FIG. 2E). Specifically, the space between the printed wiring substrate and the surface mount device is filled with the under-filling resin. The under-filling resin preferably has a curing reaction-initiating temperature of 100 to 250 (particular 150 to 200°) C. Specific examples of the under-filling resin include epoxy resin, silicone resin, polyimide resin, polyolefin resin, cyanate ester resin, phenolic resin, and naphthalene resin. At least one of these resins may be employed.

Before and/or after putting in the under-filling resin, there is performed the vacuum treatment and/or heating at a temperature lower than the curing reaction-initiating temperature of any of the applied resin and the under-filling resin (hereinafter this heating process may be referred to as "heating C"). In one embodiment, reflow soldering, and sequentially any one of i)-iii) as follows are performed, and then thermally curing of the resins (applied resin and under-filling resin) is performed:

i) the vacuum treatment and/or heating C, and putting in the under-filling resin, ii) the vacuum treatment and/or heating C, and putting in the under-filling resin, and the vacuum treatment and/or heating C, iii) putting in the under-filling resin, and the vacuum treatment and/or heating C.

The vacuum treatment and heating C may be performed singly or in combination, and sequentially in any order or simultaneously. Preferably, at least the vacuum treatment is preformed, and heating C is performed before putting in the under-filling resin.

The vacuum treatment may be performed through the same procedure as described above. Through the vacuum treatment, dehydration and defoaming of the resins (e.g., applied resin and filled resin) may be completed.

Heating C may be performed through the same procedure as that of heating B. Through heating C, dehydration/defoaming and putting in the under-filling resin are facilitated. However, in the case where heating C is performed after putting in the under-filling resin, the heating temperature is adjusted to be lower than the curing reaction-initiating temperature of any of the applied resin and the under-filling resin so as not to cause curing reaction of the applied resin and the under-filling resin.

Figure 2F:
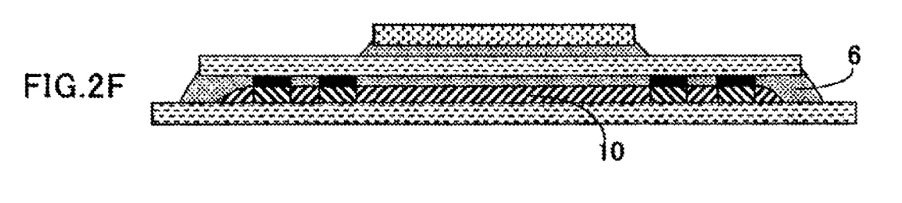

Subsequently, the applied resin 10 and the under-filling resin 6 are thermally cured (FIG. 2F). The thermal curing temperature is equal to or higher than the curing reaction-initiating temperature provided by the curing agent and equal to or higher than the curing temperature of the under-filling resin. Specific thermal curing conditions include 150 to 200° C. for 1 to 12 hours.

As described above, the printed wiring board of the present invention including the under-filling resin is produced.

EXAMPLES

The present invention will next be described in detail by way of examples.

Preparation of Active Resin Composition

Preparation Examples 1 to 5

Ingredients (compositions shown in Table 1) were uniformly mixed together, to thereby prepare active resin compositions (Preparation Examples 1 to 5).

Production of Printed Wiring Board

Examples 1 to 5

Figure 3A:
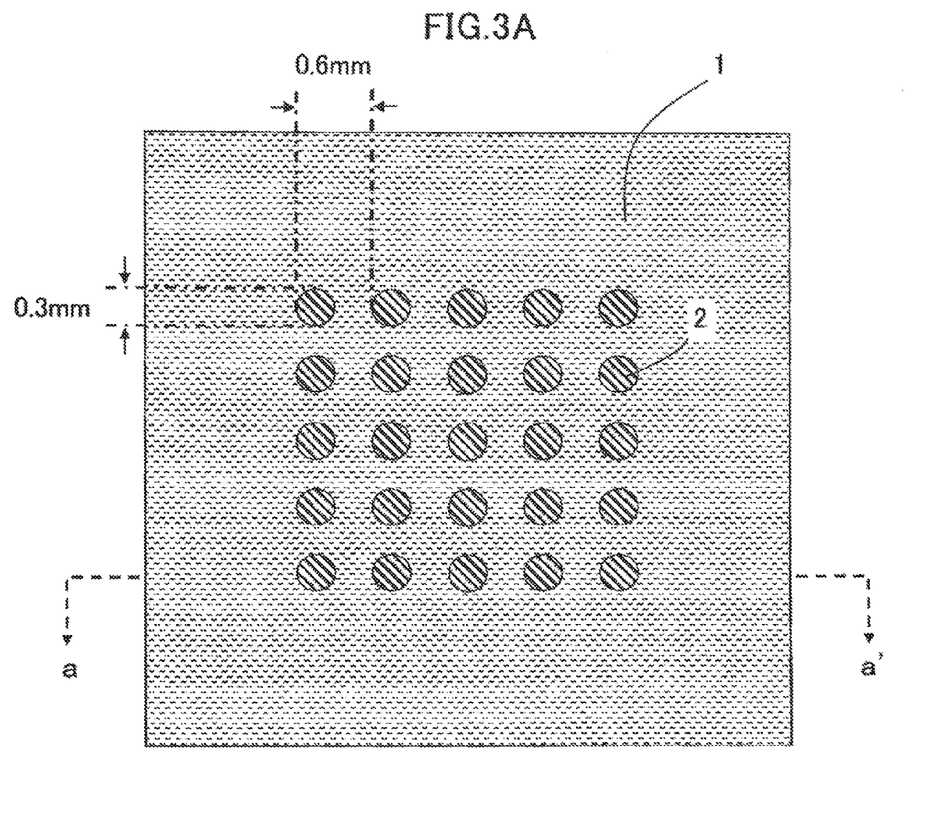
FIG. 3A is a plan view of a printed wiring substrate employed in Examples 1 to 5.
Figure 3B:
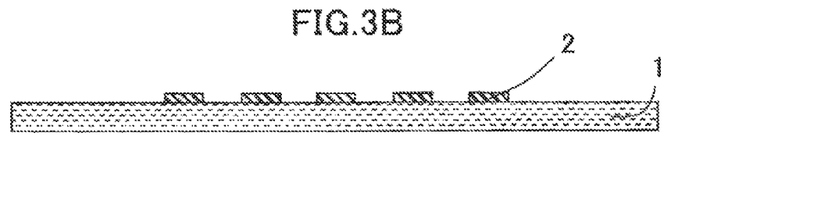
FIG. 3B is a cross-section of the printed wiring substrate shown in FIG. 3A, cut along a-a'.
Figure 4A:
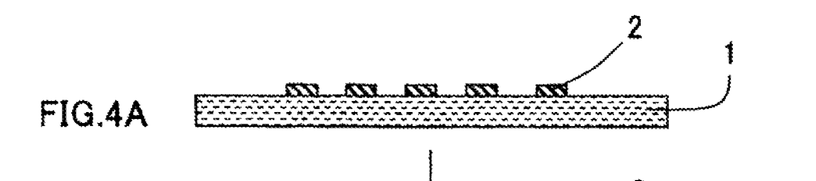
FIGS. 4A, 4B, 4C, 4D, and 4E are sketches with cross-sections showing steps of an embodiment of the mounting method employed in the Examples.
Figure 4B:
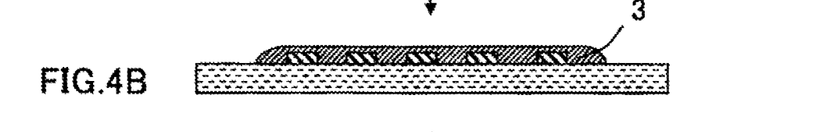

Each of the above-prepared active resin compositions (Preparation Examples 1 to 5) 3 (FIG. 4B) was applied, through screen printing, to the entire surface of a printed wiring substrate 1 (FIG. 3A, 3B, FIG. 4A) (10 mm×10 mm) having pads (FIG. 4A) (pitch: 0.6 mm, pad diameter: 0.3 mm, number of pads: 25) (FIG. 4B).

Thereafter, the printed wiring substrate was heated at 100° C. for 20 minutes, to thereby dry the applied resin. After cooling to room temperature, the applied resin coated on the printed wiring substrate assumed the form of non-tacky solid and was found to have a pencil hardness of HB.

When the printed wiring substrate was heated to 120° C., the applied resin was softened and exhibited tacky property.

Figure 4C:
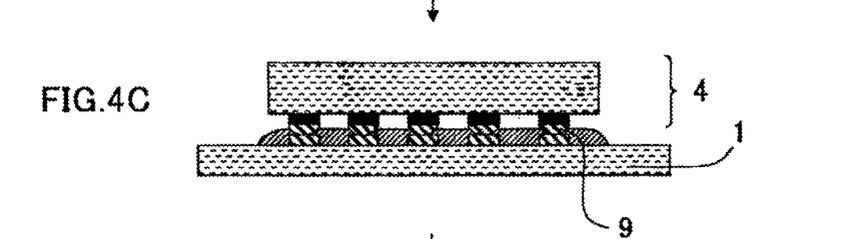
Figures 5A, 5B:
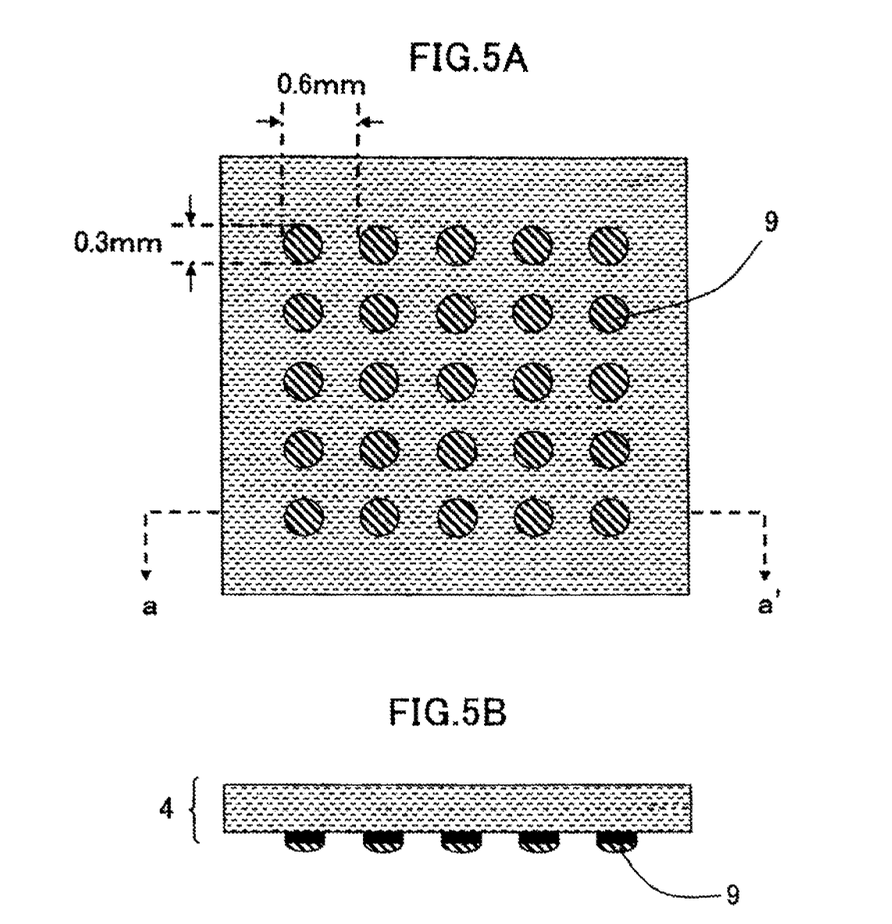
FIG. 5A is a bottom plan view of a semiconductor chip employed in Examples 1 to 5.
FIG. 5B is a cross-section of the semiconductor chip shown in FIG. 5A, cut along a-a'.

While the applied resin remained soft, a semiconductor chip 4 (4 mm×4 mm) (FIG. 5A, 5B, FIG. 4C) having bumps 9 (FIG. 4C) (pitch: 0.6 mm, bump diameter: 0.3 mm, number of bumps: 25) was mounted by means of a mounter onto the printed wiring substrate (FIG. 4C).

Figure 4D:
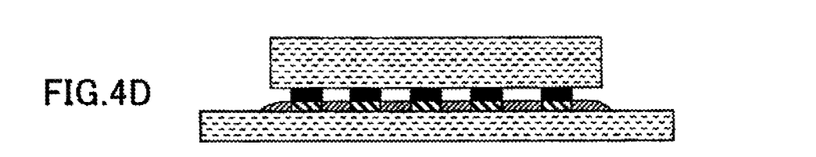

The printed wiring substrate 1 (FIG. 4C) on which the semiconductor chip 4 (FIG. 4C) was mounted was reflow-soldered by means of a reflow apparatus (preliminary heating: 150 to 180° C. for 60 seconds, reflow heating: 220 to 260° C. for 30 seconds) (FIG. 4D).

When the printed wiring substrate to which the semiconductor chip was bonded via soldering was cooled, the applied resin surface assumed the form of solid having a pencil hardness of HB.

Thereafter, when the printed wiring substrate was heated again to 120° C., the applied resin was softened again and exhibited tacky property. While the temperature was maintained at 120° C., the printed wiring substrate was subjected to vacuum treatment (vacuum degree: 100 Pa, 2 minutes).

Figure 4E:
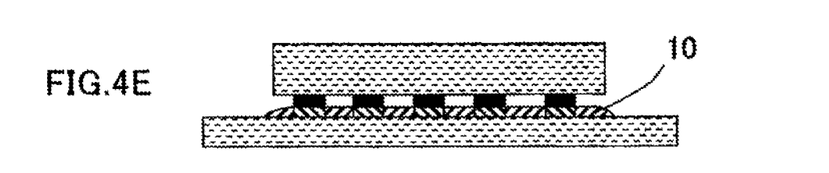

The printed wiring substrate was heated (190° C. for 2 hours), to thereby cure the active resin composition, to thereby produce each of the printed wiring boards (Examples 1 to 5). After curing, the applied resin surface exhibited a pencil hardness of 8H, indicating that the resin was completely cured (FIG. 4E).

The semiconductor chip was physically peeled from each of the printed wiring boards (Examples 1 to 5). When the active resin composition was observed under a magnifying glass (×20), no forms or voids were observed.

Comparative Example 1

The procedure of Example 1 (production of a printed wiring board) was repeated, except that no heating at 120° C. or vacuum treatment was performed before thermal curing of the active resin composition, to thereby produce a printed wiring board (Comparative Example 1).

The semiconductor chip was physically peeled from the printed wiring board (Comparative Example 1). When the cured active resin composition was observed under a magnifying glass (×20), 17 bubbles and voids were observed. The sizes of the bubbles and voids were found to be 0.5 to 2 mm.

Example 6

Firstly, a uniform paste-like active resin composition having the following compositional proportions was prepared (Preparation Example 6).

Composition: cresol novolak-type epoxy resin (softening temperature: 94° C.) (100 parts by weight), p-hydroxybenzoic acid (4 parts by weight), dicyan diamide (5 parts by weight), and propylene glycol methyl ether acetate (50 parts by weight).

Figure 6A:
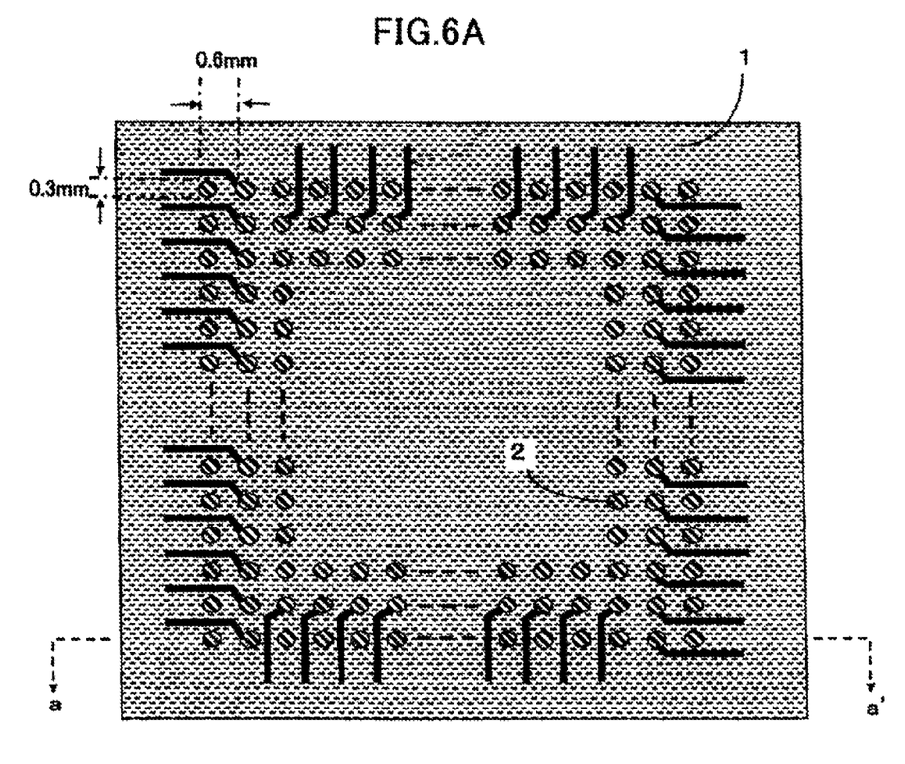
FIG. 6A is a plan view of another printed wiring substrate employed in Examples 1 to 5.
Figure 6B:
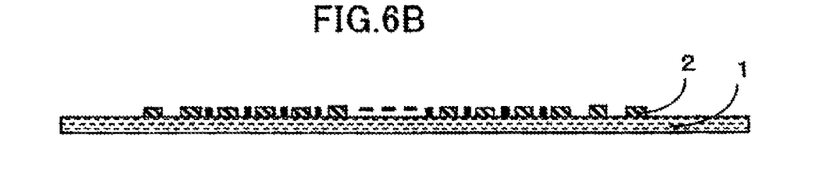
FIG. 6B is a cross-section of the printed wiring substrate shown in FIG. 6A, cut along a-a'.

The above paste-like active resin composition (Preparation Example 6) was applied, through screen printing, to the entire surface of a printed wiring substrate 1 (FIG. 6) (100 mm×100 mm) having pads (pad pitch: 0.6 mm, pad diameter: 0.3 mm, number of pads: 1,010).

Thereafter, the printed wiring substrate was heated at 100° C. for 20 minutes, to thereby dry the applied resin. After cooling to room temperature, the applied resin coated on the printed wiring substrate assumed non-tacky solid and was found to have a pencil hardness of HB.

When the printed wiring substrate was heated to 120° C., the applied resin was softened and exhibited tacky property.

Figure 7A:
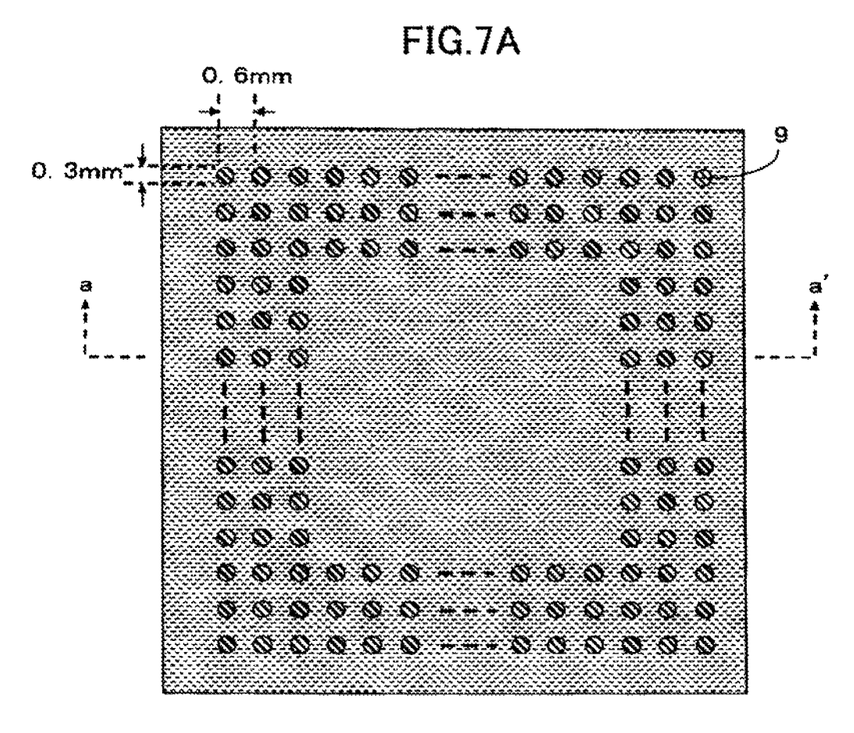
FIG. 7A is a bottom plan view of a BGA part employed in Examples 1 to 5.
Figure 7B:
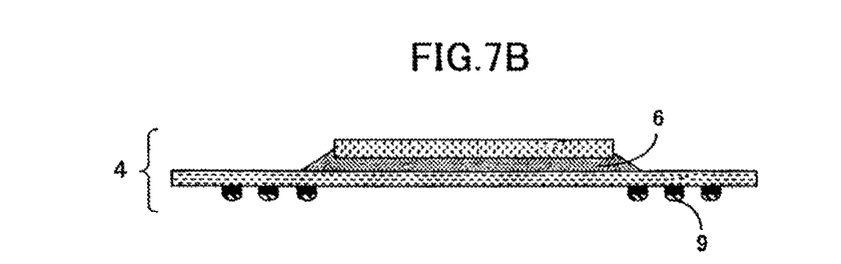
FIG. 7B is a cross-section of the BGA part shown in FIG. 7A, cut along a-a'.

While the applied resin remained soft, a BGA part 4 (70 mm×70 mm) (FIG. 7) (bump pitch: 0.6 mm, bump diameter: 0.3 mm, number of bumps: 1,010) were mounted by means of a mounter onto the printed wiring substrate.

The printed wiring substrate on which the BGA part was mounted was reflow-soldered by means of a reflow apparatus (peak temperature: 260° C.)

When the printed wiring substrate to which the BGA part was bonded via soldering was cooled, the applied resin surface assumed the form of solid having a pencil hardness of HB.

Thereafter, when the printed wiring substrate was heated again to 120° C., the applied resin was softened again and exhibited tacky property. While the temperature was maintained at 120° C., the printed wiring substrate was subjected to vacuum treatment (vacuum degree: 150 Pa, 60 minutes).

The printed wiring substrate was heated (190° C. for 2 hours), to thereby cure the active resin composition, to thereby produce a printed wiring boards (Example 6). After curing, the applied resin surface exhibited a pencil hardness of 8H, indicating that the resin was completely cured.

The BGA part was physically peeled from the printed wiring board (Example 6). When the cured active resin composition was observed under a magnifying glass (×20), no bubbles or voids were observed.

Example 7

Firstly, similar to the method of producing the printed wiring board (Example 6), the steps to the reflow soldering were performed.

When the printed wiring substrate to which the BGA part was bonded via soldering was cooled, the applied resin surface assumed the form of solid having a pencil hardness of HB.

Thereafter, when the printed wiring substrate was heated again to 120° C., the applied resin was softened again and exhibited tacky property.

While the temperature was maintained, an under-filling resin (CEL-C-3720, product of Hitachi Chemical Co., Ltd.) was charged.

Thereafter, the printed wiring substrate was subjected to vacuum treatment (vacuum degree: 150 Pa, 30 minutes).

The printed wiring substrate was heated (190° C. for 2 hours), to thereby cure the active resin composition and under-filling resin, to thereby produce a printed wiring boards (Example 7).

The thus-produced printed wiring board (Example 7) was subjected to X-ray observation. Either the cured active resin composition or the cured under-filling resin was found to contain no bubbles or voids. The cavities unfilled with the cured under-filling resin were no found.

Examples 8 to 12

The procedure of Example 7 (production of a printed wiring board) was repeated, except that an active resin composition of any of Preparation Examples 1 to 5 was used instead of the active resin composition of Preparation Example 6, to thereby produce each of the printed wiring boards (Examples 8 to 12).

The thus-produced printed wiring boards (Examples 8 to 12) were subjected to X-ray observation. In each case, either the cured active resin composition or the cured under-filling resin was found to contain no bubbles or voids. The cavities unfilled with the cured under-filling resin were no found.

Comparative Example 2

The procedure of Example 8 (production of a printed wiring board) was repeated, except that no heating at 120° C. or vacuum treatment was performed before thermal curing of the active resin composition and the under-filling resin, to thereby produce a printed wiring board (Comparative Example 2).

The thus-produced printed wiring board (Comparative Example 2) was subjected to X-ray observation. In the cured active resin composition and under-filling resin, 22 bubbles and voids were observed. The sizes of the bubbles and voids were found to be 0.5 to 2 mm. Two cavities unfilled with the cured under-filling resin were observed, and the sizes of the cavities were 4 mm and 7 mm, respectively.

<Active Resin Composition Performance Test>

Solder Bonding Test

Each active resin composition (storage period: 0 day) was used, and the steps from application of active resin to reflow soldering were performed in a manner similar to that employed in the method of producing the printed wiring board (any of Examples 1 to 5). Thereafter, the printed wiring substrate was cooled, and a BGA part was forcedly peeled from the printed wiring board. Among 25 solder bumps, the number of bumps bonded to the land of the printed wiring substrate was counted. Table 1 shows the ratio of bonded solder bump (percent solder bonding).

Storage Stability (25° C.)

The solder bonding test was repeated, except that an active resin composition of a different storage period was used instead of the active resin composition (storage period: 0 day). There was determined the period of time when the percent solder bonding attained by the composition (storage period: 0 day) was maintained. Table 1 shows the data (storage limit).

TABLE 1

| Ingredients (parts by wt.) | Preparation Examples | | | | |
|---|---|---|---|---|---|
| | 1 | 2 | 3 | 4 | 5 |
| Cresol novolak epoxy resin[1] | 100 | — | 100 | — | 100 |
| Bisphenol A type liq. epoxy resin[2] | — | 100 | — | 100 | — |
| Santacid G | 10 | 35 | 10 | 20 | — |
| Nofcure TN-2 | 10 | — | 5 | — | — |
| Hydroxybenzoic acid | — | — | — | — | 4 |
| Dicyan diamide | 4 | 4 | 4 | 4 | 1 |
| Diethylene glycol monoethyl ether acetate | 30 | — | 30 | — | 30 |
| Solder bonding | 100% | 100% | 100% | 100% | 80% |
| Storage stability (25° C.) | ≥60 days | ≥60 days | ≥60 days | ≥60 days | 2 days |

[1]Nippon Kayaku Co., Ltd. "EOCN-103"
[2]Nippon Kayaku Co., Ltd. "RE-310S"

What is claimed is:

1. A surface mounting method comprising:
   applying a curable active resin composition to at least a part of a surface of a printed wiring substrate, the curable active resin composition comprising an epoxy resin in an amount of 100 parts by weight, a blocked carboxylic acid compound in an amount of 1 to 50 parts by weight and/or a carboxylic acid compound in an amount of 1 to 10 parts by weight, and a curing agent which can initiate curing reaction at 150° C. or higher, in an amount of 1 to 30 parts by weight;
   optionally, as needed, drying the applied curable active resin composition;
   optionally, as needed, heating the applied curable active resin composition at a temperature which is equal to or higher than the softening temperature of the applied curable active resin composition and which is lower than the curing reaction-initiating temperature of the applied curable active resin composition;
   subsequently, mounting a surface mount device on the printed wiring substrate by contacting the applied curable active resin composition with the surface mount device;
   performing reflow soldering on the mounted device;
   heating and/or performing a vacuum treatment on the applied curable active resin composition of the reflow soldered device, wherein said heating is performed at a temperature lower than the curing reaction-initiating temperature of the applied curable active resin composition; and
   thermally curing the applied curable active resin composition of the reflow soldered device.

2. The surface mounting method according to claim 1, wherein the curable active resin composition is applied to at least a part of a metallic surface of the printed wiring substrate.

3. The surface mounting method according to claim 2, wherein at least one of the optional drying and the optional heating of the applied curable active resin composition is performed before mounting the surface mount device on the printed wiring substrate.

4. The surface mounting method according to claim 2, wherein both the optional drying and the optional heating of the applied curable active resin composition are performed before mounting the surface mount device on the printed wiring substrate.

5. The surface mounting method according to claim 1, wherein at least one of the optional drying and the optional heating of the applied curable active resin composition is performed before mounting the surface mount device on the printed wiring substrate.

6. The surface mounting method according to claim 1, wherein both the optional drying and the optional heating of the applied curable active resin composition are performed before mounting the surface mount device on the printed wiring substrate.

7. A surface mounting method comprising:
   applying a curable active resin composition to at least a part of a surface of a printed wiring substrate, the curable active resin composition comprising an epoxy resin in an amount of 100 parts by weight, a blocked carboxylic acid compound in an amount of 1 to 50 parts by weight and/or a carboxylic acid compound in an amount of 1 to 10 parts by weight, and a curing agent which can initiate curing reaction at 150° C. or higher, in an amount of 1 to 30 parts by weight;
   optionally, as needed, drying the applied curable active resin composition;
   optionally, as needed, heating the applied curable active resin composition at a temperature which is equal to or higher than the softening temperature of the applied curable active resin composition and which is lower than the curing reaction-initiating temperature of the applied curable active resin composition;
   subsequently, mounting a surface mount device on the printed wiring substrate by contacting the applied curable active resin composition with the surface mount device;
   performing reflow soldering on the mounted device;
   putting a curable under-filling resin into a space of interest of the reflow soldered device; and
   thermally curing the applied curable active resin composition and the curable under-filling resin of the reflow soldered device;
   wherein the method further comprises at least one of the following additional steps: (i) heating and/or performing a vacuum treatment on the applied curable active resin composition of the reflow soldered device before putting the curable under-filling resin into a space of interest of the reflow soldered device, wherein said heating is performed at a temperature lower than the curing reaction-initiating temperature of the applied curable active resin composition; and (ii) heating and/or performing a vacuum treatment on the applied curable active resin composition and the curable under-filling resin of the reflow soldered device after putting the curable under-filling resin into a space of interest of the reflow soldered device, wherein said heating is performed at a temperature lower than the curing reaction-initiating temperatures of the applied curable active resin composition and curable under-filling resin.

8. The surface mounting method according to claim 7, wherein the curable active resin composition is applied to at least a part of a metallic surface of the printed wiring substrate.

9. The surface mounting method according to claim 8, wherein at least one of the optional drying and the optional heating of the applied curable active resin composition is performed before mounting the surface mount device on the printed wiring substrate.

10. The surface mounting method according to claim 8, wherein both the optional drying and the optional heating of the applied curable active resin composition are performed before mounting the surface mount device on the printed wiring substrate.

11. The surface mounting method according to claim 7, wherein at least one of the optional drying and the optional heating of the applied curable active resin composition is performed before mounting the surface mount device on the printed wiring substrate.

12. The surface mounting method according to claim 7, wherein both the optional drying and the optional heating of the applied curable active resin composition are performed before mounting the surface mount device on the printed wiring substrate.

* * * * *